United States Patent
Kao et al.

(10) Patent No.: US 7,741,911 B2
(45) Date of Patent: Jun. 22, 2010

(54) CIRCUIT AND METHOD FOR DYNAMIC CURRENT COMPENSATION

(75) Inventors: Shiau-Wen Kao, Hsinchu (TW); Ming-Ching Kuo, Hsinchu (TW); Chih-Hung Chen, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 15 days.

(21) Appl. No.: 12/170,866

(22) Filed: Jul. 10, 2008

(65) Prior Publication Data

US 2009/0108938 A1    Apr. 30, 2009

Related U.S. Application Data

(60) Provisional application No. 60/960,987, filed on Oct. 24, 2007.

(51) Int. Cl.
*H03F 3/45* (2006.01)
(52) U.S. Cl. .................................. 330/261; 330/257
(58) Field of Classification Search .......... 330/252–261
See application file for complete search history.

(56) References Cited

U.S. PATENT DOCUMENTS 7,215,199 B2 *   5/2007   Marholev ................. 330/258
2009/0108934 A1 *   4/2009   Forejt ..................... 330/253

\* cited by examiner

*Primary Examiner*—Robert Pascal
*Assistant Examiner*—Hieu P Nguyen
(74) *Attorney, Agent, or Firm*—Finnegan, Henderson, Farabow, Garrett & Dunner, LLP

(57) ABSTRACT

An operational amplifier includes a first stage and a second stage, the first stage for receiving two input signals and the second stage being coupled to the first stage, wherein the second stage includes a first part with a first output of the operational amplifier, and a second part with a second output of the operational amplifier. A method includes providing a first current to the first part of the second stage, and providing a second current to the second part of the second stage. The method further includes adjusting the first current based on a current consumption of the first part of the second stage, and adjusting the second current based on a current consumption of the second part of the second stage, wherein the sum of the first current and the second current is substantially constant.

21 Claims, 3 Drawing Sheets

CIRCUIT AND METHOD FOR DYNAMIC CURRENT COMPENSATION

PRIORITY

This application claims the benefit of U.S. Provisional Application No. 60/960,987, filed Oct. 24, 2007, which is incorporated by reference herein in its entirety for any purpose.

TECHNICAL FIELD

The present disclosure relates generally to circuits and methods for current compensation and, more particularly, to circuits and methods for dynamic current compensation.

DESCRIPTION OF THE RELATED ART

Operational amplifiers (op-amps), are one of the most widely used electronic devices. Op-amps can be found in an array of commercial, consumer, and scientific devices. Op-amps may be used, for example, to perform logic operations, e.g., voltage comparisons, as well as mathematical calculations.

Typically, op-amps are direct current (DC) coupled electronic voltage amplifiers having a plurality of inputs and outputs, wherein only one of the outputs is used to drive a load. As illustrated in FIG. 1, a "+" input 100 and a "−" input 102 of an op-amp 104 may, respectively, receive a first alternating current (AC) voltage input S1 with a given amplitude, and a second AC voltage input S2, wherein S2 is an inverted signal of S1. Ideally, the output of the op-amp would be the amplification of the difference in voltage between the two inputs. This output is commonly referred to as the amplification of the "differential input voltage."

In FIG. 1, a "−" output 106 and a "+" output 108 of op-amp 104 provide output signals having the same polarity as signals S2 and S1, respectively, received on "−" input 102 and "+" input 100.

In its typical use, an op-amp's output is controlled by feeding a portion of the output back to an inverting one of its inputs (negative feedback). In addition, an op-amp may be composed of a plurality of parts (stages), wherein the number of stages in an op-amp is dependent upon the desired application. For example, an op-amp may be composed of input stages, frequency shaping stages, and output stages. Alternatively, an op-amp may be composed of only input and output stages.

Op-amps may be differentiated into several classes based on their input voltage and output current relationships, e.g., class A, class B, class AB, and the like. The class A op-amp has a fixed static load current, resulting in relatively high power consumption and relatively high small-signal linearity. Conversely, the class B op-amp has a zero static load current under average loads, resulting in relatively low power consumption and relatively low small-signal linearity. The class AB op-amp falls between the class A and class B op-amps with regard to power consumption and small-signal linearity. However, the class AB op-amp may be unable to properly control static current at its output stage, resulting in it being prone to various effects from, e.g., manufacturing process, operating voltages, and/or temperature. Additionally, because of fixed bias current, the class AB op-amp's average current consumption cannot be clearly defined, resulting in difficulty estimating the average power consumption.

SUMMARY

In one aspect, the present disclosure is directed to a method for dynamic current compensation in an operational amplifier, wherein the operational amplifier includes a first stage and a second stage, the first stage for receiving two input signals and the second stage being coupled to the first stage, wherein the second stage includes a first part with a first output of the operational amplifier, and a second part with a second output of the operational amplifier. The method includes providing a first current to the first part of the second stage and providing a second current to the second part of the second stage. The method further includes adjusting the first current based on a current consumption of the first part of the second stage and adjusting the second current based on a current consumption of the second part of the second stage, wherein the sum of the first current and the second current is substantially constant.

In another aspect, the present disclosure is directed to an operational amplifier capable of dynamically compensating for varying current needs. The operational amplifier includes a first stage configured to receive two input signals and a second stage coupled to the first stage, wherein the second stage includes a first part with a first output of the operational amplifier, and a second part with a second output of the operational amplifier. The operational amplifier further includes a first current source configured to provide a first bias current for biasing the first part of the second stage and a second current source configured to provide a second bias current for biasing the second part of the second stage.

DETAILED DESCRIPTION

Figure 1:
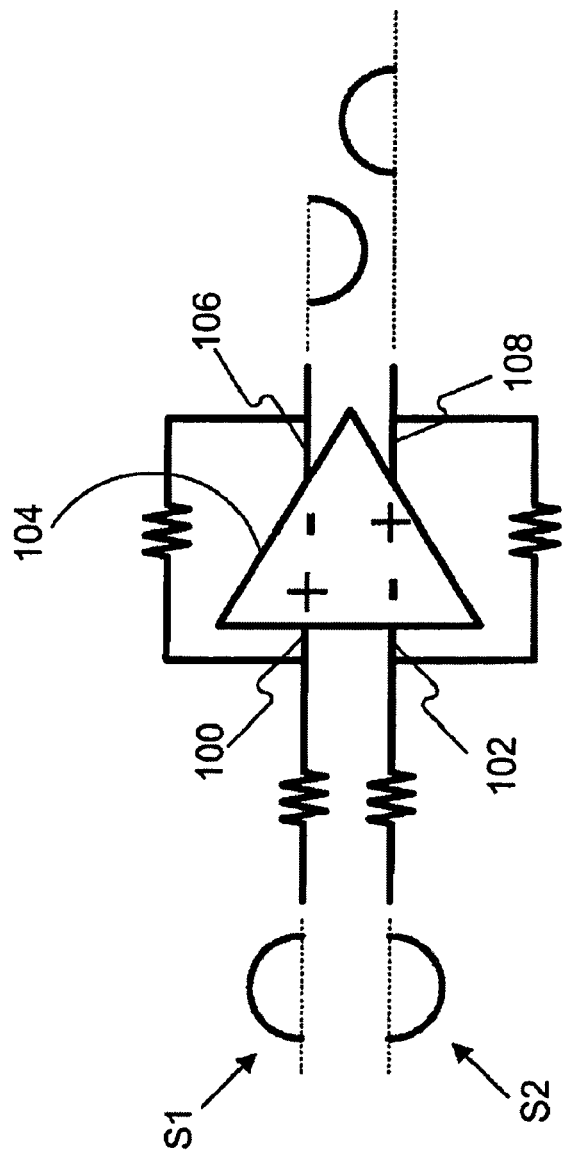
FIG. 1 is a diagrammatic illustration of an exemplary disclosed operational amplifier.
Figure 2:
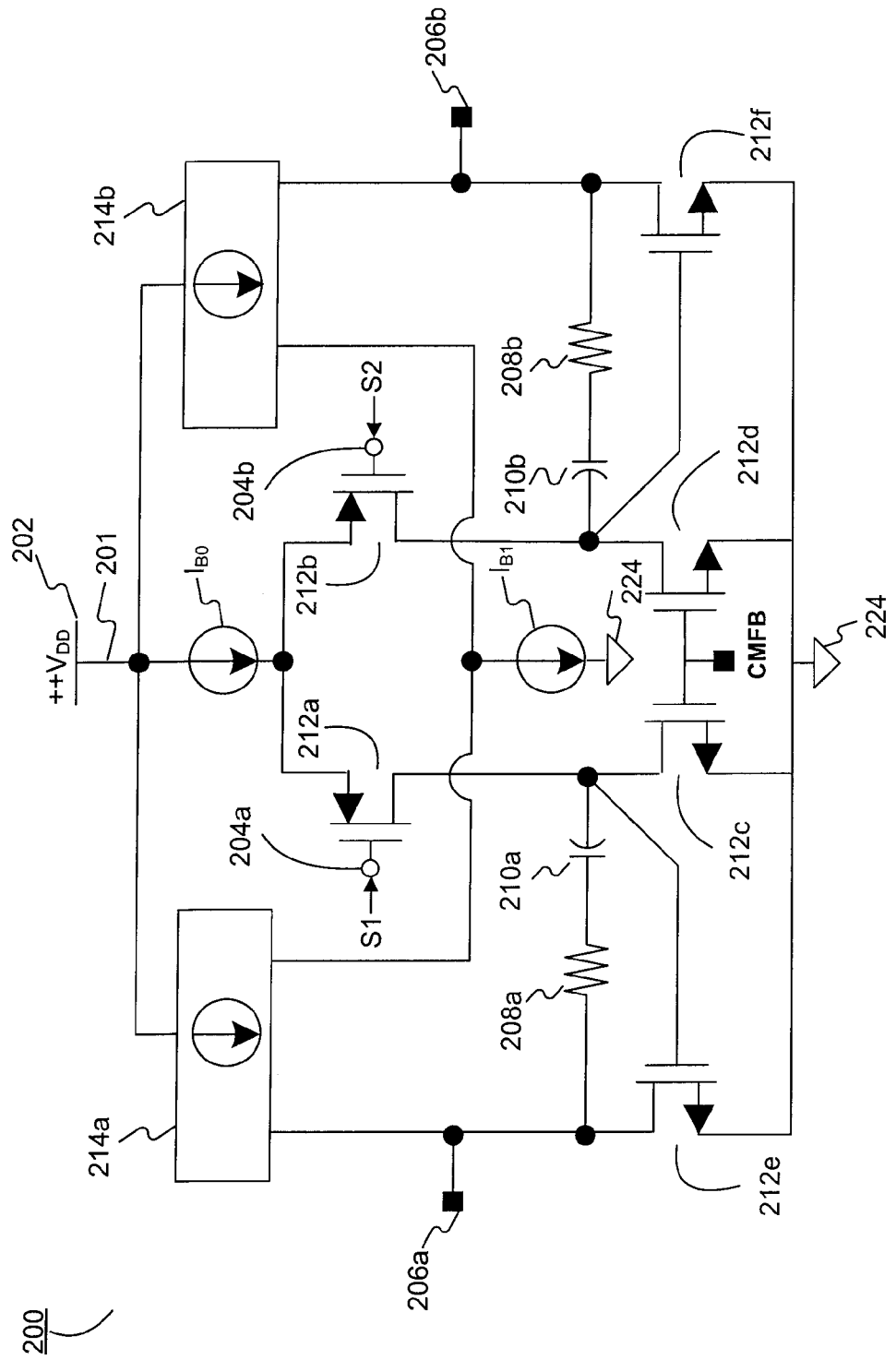
FIG. 2 is a diagrammatic illustration of an exemplary disclosed operational amplifier using dynamic current compensation.

FIG. 2 illustrates an exemplary differential type operational amplifier (op-amp) 200 consistent with the present disclosure. As illustrated herein, op-amp 200 may be, for example, an integrated circuit that performs some type of operation associated with an application such as, for example, radio and television transmitters and receivers, high-fidelity stereo equipment, instrument amplifiers, microcomputers, and/or other electronic equipment. Exemplary op-amp 200 is illustrated as a differential operational amplifier, but may be representative of an op-amp configured to serve as a non-inverting amplifier, a voltage follower, a summing amplifier, an integrator, a differentiator, a comparator, etc.

An op-amp may have a characteristic such that the linearity in its output signal decreases when the amplitude of its output signal grows larger. For example, as the output signal amplitude increases, the amount of current consumed by a load coupled to the output stage of an op-amp also increases. At the same time, the output stage of the op-amp may also require higher bias current to match the current consumed by the load due to the increased output signal. A conventional op-amp may be unable to meet such increased current demands at an increased output signal amplitude and, as a result, the output signal may fail to reach a desired level. As a result, the linearity in the output signal may be degraded.

Op-amp 200 may be configured to dynamically compensate for the varying current needs at its output stages, referred to herein as second stages, while still maintaining total current consumption, thus resulting in relatively high large-signal linearity and relatively low average power consumption. The structure and operation of op-amp 200 are described in further detail below.

As shown in FIG. 2, op-amp 200 includes, for example, an electrical connection 201 configured to receive electrical power from a power supply ($V_{DD}$) 202; an op-amp input 204a and an op-amp input 204b, collectively referred to herein as op-amp inputs 204; an op-amp output 206a and an op-amp output 206b, collectively referred to herein as op-amp outputs 206; and a transistor 212a, a transistor 212b, a transistor 212c, a transistor 212d, a transistor 212e, and a transistor 212f, collectively referred to herein as transistors 212. In the embodiment shown in FIG. 2, each of transistors 212 is an MOSFET. Op-amp 200 may further include a resistor 208a and a resistor 208b, collectively referred to herein as resistors 208; a capacitor 210a and a capacitor 210b, collectively referred to herein as capacitors 210; and a current source (CS) 214a and a CS 214b, collectively referred to herein as CSs 214. The number and configuration of capacitors, resistors, current sources, and/or transistors are illustrative of one exemplary embodiment, it being contemplated that different quantities and configurations of capacitors, resistors, current sources, and/or transistors may be used.

As shown in FIG. 2, op-amp 200 includes a differential input stage, referred to herein as a first stage, in which op-amp inputs 204 serve as a differential input, comprising the two p-type transistors 212a and 212b, and a current source $I_{B0}$ coupled to the power supply $V_{DD}$ 202 for supplying current to the first stage. The source terminals of transistors 212a and 212b are coupled together and further coupled to receive current supplied by current source $I_{B0}$. The gate terminals of transistors 212a and 212b are configured for receiving two respective input signals S1 and S2 at op-amp inputs 204a and 204b, respectively, wherein S2 is an inversion of S1. The drain terminals of transistors 212a and 212b provide output signals to the load of the first stage, which may be a common mode feedback loop including the two n-type transistors 212c and 212d. In FIG. 2, the drain terminals of transistors 212c and 212d are respectively coupled to the drain terminals of transistors 212a and 212b, the source terminals of transistors 212c and 212d are coupled to a ground or reference potential 224, and the gate terminals of transistors 212c and 212d are coupled together for receiving a common mode feedback signal (CMFB). A common mode feedback loop is well-known in the art and is not shown in detail in FIG. 2 and not described herein.

Op-amp 200 further includes a second stage for processing the output signals of the first stage, in which op-amp outputs 206 serve as a differential output. As shown in FIG. 2, the second stage includes transistors 212e and 212f configured as common-source amplifiers. The gate terminals of transistors 212e and 212f are coupled to receive the output signals of the first stage from the drain terminals of transistors 212a and 212b, respectively. The source terminals of transistors 212e and 212f are coupled to ground or reference potential 224. The second stage provides output signals of op-amp 200 at the drain terminals of transistors 212e and 212f, and the differential output provided by op-amp outputs 206a and 206b, respectively.

Op-amp 200 further includes feedback loops comprising resistors 208 and capacitors 210 to facilitate the stable operation of op-amp 200. More specifically, resistor 208a and capacitor 210a are coupled between the drain terminal of transistor 212e and the gate terminal of transistor 212e for feeding back a portion of the output signal to the first stage of op-amp 200. Resistor 208b and capacitor 210b are coupled between the drain terminal of transistor 212f and the gate terminal of transistor 212f for feeding back a portion of the output signal to the first stage of op-amp 200. The feedback loops may facilitate stable operation by, for example, minimizing or preventing a phase margin and/or a gain margin.

The second stage of op-amp 200 also includes CSs 214a, 214b and $I_{B1}$. Current source $I_{B1}$ provides current to CSs 214a and 214b, while CSs 214a and 214b respectively provide bias currents to, and act as the loads of, the two common-source amplifiers comprised of transistors 212e and 212f.

After initiation of $V_{DD}$ 202, AC voltage signals may be applied to op-amp inputs 204, which will result in signals at the drain terminals of transistors 212a, 212b (in the form of voltage signals), and an adjustment of the division of the $I_{B0}$ current between transistors 212a, 212b. For example, in one exemplary embodiment, the input signal at transistor 212a may be an AC voltage signal (S1), and the input signal at transistor 212b may be an inverted voltage signal of S1 (S2), i.e., the phase shift between S1 and S2 is 180 degrees.

As input signals 204a and 204b vary, the currents flowing through transistors 212a and 212b correspondingly vary. Through the load of the first stage, i.e., the common mode feedback loop comprised of transistors 212c and 212d, the current variations are output as voltage signals to the second stage of op-amp 200, i.e., transistors 212e, and 212f. The voltage signals provided to the common-source amplifiers comprised of transistors 212e and 212f, are amplified thereby to form output signals at op-amp outputs 206.

When the output signals at op-amp outputs 206 are relatively small in amplitude, a load coupled to op-amp outputs 206 is driven according to the amplitude of the output signal at op-amp outputs 206. When the output signals at op-amp outputs 206 are relatively large in amplitude, the load attempts to draw a correspondingly large amount of current. At the same time, the common-source amplifiers represented by transistors 212e and 212f also require relatively large amounts of currents. If CSs 214a and 214b cannot meet these current demands, the linearity of output signals at op-amp outputs 206 may be degraded.

Consistent with embodiments of the present invention, CSs 214a and 214b are configured such that when the amplitude of the output signals at op-amp outputs 206 increase, the amount of current provided by the respective CSs 214a or 214b also increases. As a result, the needs of increased current at the second stages of op-amp 200 are dynamically compensated corresponding to the input signals, thereby preserving the linearity of the output signals at op-amp outputs 206. That is, the increase in amplitude of the input signals results in an increase in the amount of current required at the respective second stage of op-amp 200. Additionally, the increase in amplitude of the input signals directs additional current to the output stage of op-amp 200 that requires additional current. In this way, CSs 214a and 214b dynamically compensate for the required current needs of op-amp 200 corresponding to the input signals, thereby preserving the linearity of the output signals at op-amp outputs 206.

In addition, consistent with op-amp outputs 206 serving as a differential output, when the current on op-amp output 206a increases, the current on op-amp output 206b decreases. Likewise, when the current on op-amp output 206b increases, the current on op-amp output 206a decreases. As a result, the total current consumption of op-amp 200 is substantially constant.

Also consistent with embodiments of the present invention, CSs 214a and 214b together provide a substantially constant amount of current, thereby preserving the total amount of current consumption. In one aspect, CS $I_{B1}$ provides a constant current output, and CSs 214a and 214b share the constant current from $I_{B1}$ between each other. CSs 214a and 214b are configured such that the currents provided to the common-source amplifiers, represented by transistors 212e and 212f, are the respective currents drawn from current source $I_{B1}$ multiplied by a constant. The currents provided to transistors 212e and 212f are described in greater detail below.

Figure 3:
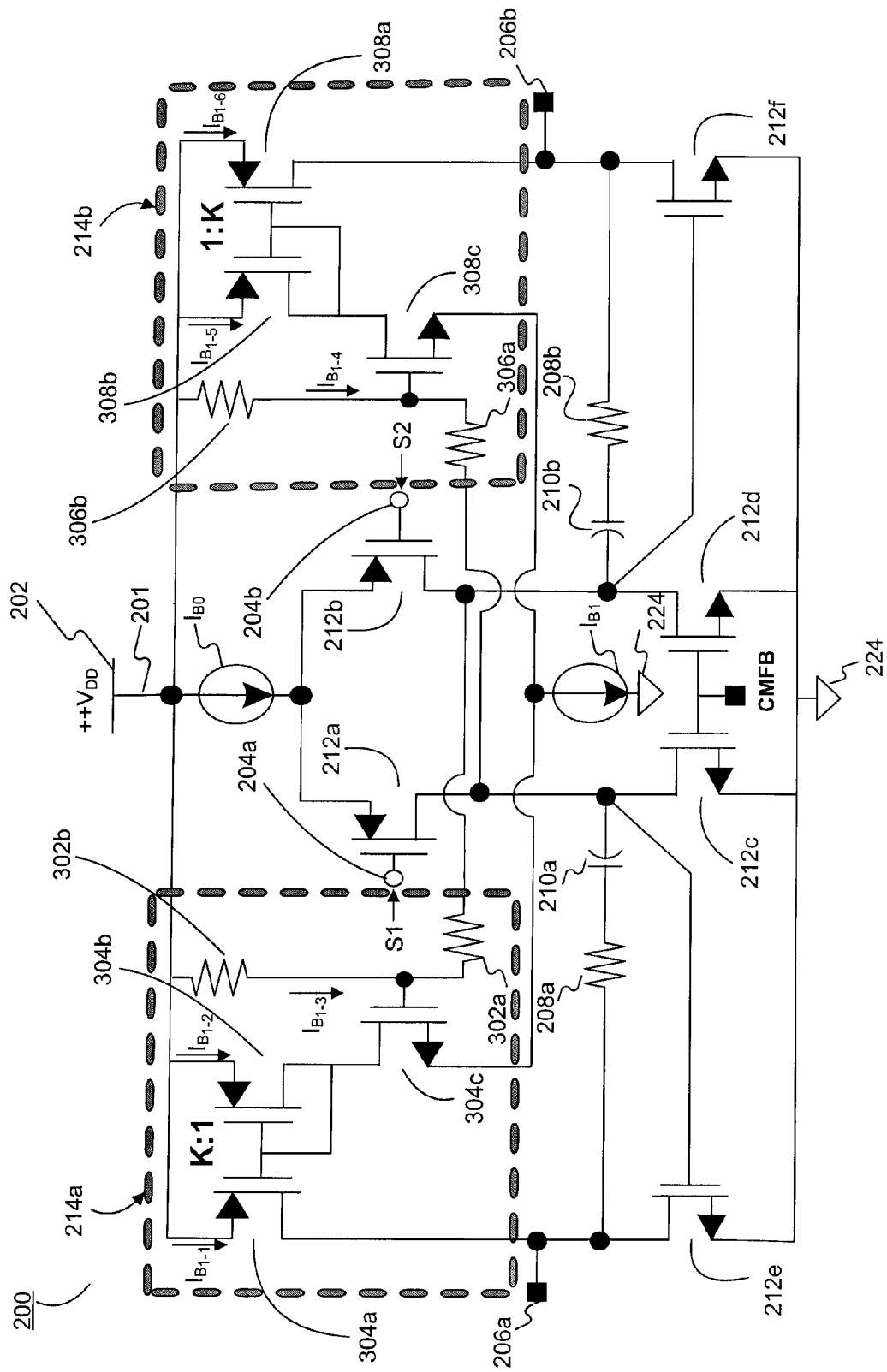
FIG. 3 is a diagrammatic illustration of an exemplary embodiment of the operational amplifier of FIG. 2.

FIG. 3 illustrates an exemplary embodiment of the op-amp 200 disclosed in FIG. 2 including an example of how current sources 214a and 214b may be configured.

As illustrated in FIG. 3, CS 214a may include a resistor 302a and a resistor 302b, collectively referred to herein as resistors 302; and an MOS transistor 304a, an MOS transistor 304b, and an MOS transistor 304c, collectively referred to herein as transistors 304. Additionally and/or alternatively, CS 214b may include a resistor 306a and a resistor 306b, collectively referred to herein as resistors 306; and an MOS transistor 308a, an MOS transistor 308b, and an MOS transistor 308c, collectively referred to herein as transistors 308.

Additionally, resistor 302a is electrically coupled between the drain terminal of transistor 212b and the gate terminal of transistor 304c. Resistor 302b is electrically coupled to resistors 302a, 306b, $V_{DD}$ 202, and the source terminals of transistors 304a, 304b, 308a, 308b. Resistor 306a is electrically coupled between the drain terminal of transistor 212a and the gate terminal of transistor 308c. Additionally, the gate terminals of transistors 304a, 304b are both coupled to the drain terminal of transistor 304b.

The value of an $I_{B1-1}$ current from the source to drain terminals of transistor 304a depends on the gate-to-source voltage drop ($V_{GS}$) of transistor 304a, which is equal to $V_{GS}$ of transistor 304b. When both of transistors 304a, 304b operate in the saturation mode, the $I_{B1-1}$ current from the source terminal to the drain terminal of transistor 304a is related to an $I_{B1-2}$ current from the source terminal to the drain terminal of transistor 304b according to the following equation (1):

$$I_{B1-1} = \frac{(W/L)_{Transistor\ 304a}}{(W/L)_{Transistor\ 304b}} I_{B1-2}. \quad (1)$$

In the numerator of equation (1), W and L are the width and length, respectively, of a channel of MOS transistor 304a. In the denominator of equation (1), W and L are the width and length, respectively, of a channel of MOS transistor 304b.

Similarly, the value of an $I_{B1-6}$ current from the source terminal to the drain terminal of transistor 308a is related to an $I_{B1-5}$ current from the source terminal to the drain terminal of transistor 308b accordingly to the following equation (2):

$$I_{B1-6} = \frac{(W/L)_{Transistor\ 308a}}{(W/L)_{Transistor\ 308b}} I_{B1-5}. \quad (2)$$

In the numerator of equation (2), W and L are the width and length, respectively, of a channel of MOS transistor 308a. In the denominator of equation (2), W and L are the width and length, respectively, of a channel of MOS transistor 308b.

As shown in FIG. 3, $I_{B1-2}$ and $I_{B1-5}$ are supplied by current source $I_{B1}$. The sum of $I_{B1-2}$ and $I_{B1-5}$ is equal to the current provided by current source $I_{B1}$. Therefore, if the ratio of the W/L value of transistor 304a to the W/L value of transistor 304b is the same as the ratio of the W/L value of transistor 308a to the W/L value of transistor 308b, the sum of currents $I_{B1-1}$ and $I_{B1-6}$ is a constant times the current provided by CS $I_{B1}$.

In addition, a change in voltage across resistors 302, 306 results in a change in the potential at the gate terminals of transistors 304c, 308c. That is, the currents $I_{B1-2}$ and $I_{B1-5}$ are functions of the voltage drops across resistors 302, 306. Because the currents flowing through transistors 304a and 308a to op-amp outputs 206 are a function of the $I_{B1-2}$ and $I_{B1-5}$ currents, the $I_{B1-1}$ and $I_{B1-6}$ currents are also functions of the voltage drops across resistors 302 and 306. Additionally, as noted above, the amount of $I_{B1-1}$ and $I_{B1-6}$ currents directed to op-amp outputs 206 will be substantially determined by the width and length ratios of the channels of the respective transistors 304, 308. As a result, the range of the $I_{B1-1}$ and $I_{B1-6}$ currents may be adjusted for desired applications by designing the sizes of the transistors 304 and 308 appropriately.

The operation of the exemplary embodiment of FIG. 3 will now be described with reference to the embodiment in which transistors 212 are implemented as MOSFETs with specific channel dimensions. However, one familiar with the art will now appreciate that transistors 212 may be any device, or combination of devices, configured to operate as an electrically controlled switch, and/or convert a signal from one format to another, e.g., bipolar junction transistor, field effect transistors, and the like, in which operating characteristics can be predetermined by adjusting dimensional parameters of the devices. It is also understood that transistors 212 may have any suitable channel dimensions.

As shown in FIG. 3, a plurality of currents within op-amp 200 are labeled, including current $I_{B1-1}$ through transistor 304a, current $I_{B1-2}$ through transistors 304b and 304c, current $I_{B1-3}$ through resistors 302, current $I_{B0}$ through transistors 212a and 212b, current $I_{B1-4}$ through resistors 306, current $I_{B1-5}$ through transistors 308b and 308c, and current $I_{B1-6}$ through transistor 308a.

Consistent with the embodiment shown in FIG. 3, CSs 214a and 214b dynamically compensate for increased current needs of the load when the input signals are relatively large in amplitude, thereby preserving large-signal linearity.

When input signals S1 and S2 are relatively small in amplitude, the signals on respective op-amp outputs 206 are relatively small in amplitude as well. Therefore, the current fluctuation at the second stage is relatively small, and the linearity of the signals at op-amp outputs 206 is not a concern. As a result of negative feedback, when, for example, signal S1, i.e., the signal applied to op-amp input 204a, is at a higher potential than S2, i.e., the signal applied to op-amp input 204b, the signal at op-amp output 206b is at a lower potential than the signal at op-amp output 206a.

Under such conditions, the signal output of the first stage at the drain of transistor 212a, which is applied across resistors 306a and 306b, is also lower than the signal at the drain of transistor 212b which is applied across resistors 302a and 302b. As a result, a relatively low bias voltage is applied to the gate of transistor 308c, resulting in the current through transistor 308c, i.e., $I_{B1-5}$, being relatively low. Because $I_{B1-6}$ is proportional to $I_{B1-5}$, $I_{B1-6}$ is also relatively low. Therefore, the total current supplied to both the load at op-amp output 206b and the common-source amplifier comprised of transistor 212f is relatively low. Conversely, the current $I_{B1-2}$ and $I_{B1-3}$ are relatively large due to the relatively large gate voltage of transistor 304c.

Also, continuing this example, when S2 is at a lower potential than S1, the current provided by CS 214a, i.e., $I_{B1-1}$, is larger than the current provided by CS 214b, i.e., $I_{B1-6}$, because, as noted above, the sum of $I_{B1-1}$ and $I_{B1-6}$ remains constant. Additionally, the sum of the currents through transistors 304c and 308c, i.e., $I_{B1-2}$ and $I_{B1-5}$, respectively, remains equal to $I_{B1}$. Therefore, as $I_{B1-5}$ increases, $I_{B1-2}$ correspondingly decreases. Because $I_{B1-1}$ is proportional to $I_{B1-2}$, $I_{B1-1}$ also decreases, resulting in a lower potential signal at op-amp output 206a.

Therefore, the circuit shown in FIG. 3 compensates for the increased current needs of op-amp 200 for large signals, while preserving the total current consumption for op-amp 200.

FIGS. 2 and 3 show each transistor to be of a certain type, i.e., either a p-type or n-type MOSFET. It is to be understood that op-amp 200 can as well be constructed with the opposite types of transistors, i.e., an n-type transistor in the place of a p-type transistor, and vice versa. It is further to be understood that op-amp 200 may also be constructed with other types transistors such as bipolar junction transistors.

It will be apparent to those skilled in the art that various modifications and variations can be made to the disclosed operational amplifier. Other embodiments will be apparent to those skilled in the art from consideration of the specification and practice of the disclosed apparatus and method. It is intended that the specification and examples be considered as exemplary only, with a true scope being indicated by the following claims and their equivalents.

What is claimed is:

1. A method for dynamic current compensation in an operational amplifier, wherein the operational amplifier includes a first stage and a second stage, the first stage for receiving two input signals and the second stage being coupled to the first stage, wherein the second stage includes a first part with a first output of the operational amplifier, and a second part with a second output of the operational amplifier, the method comprising:
   providing a first current to the first part of the second stage;
   providing a second current to the second part of the second stage;
   adjusting the first current based on a current consumption of the first part of the second stage; and
   adjusting the second current based on a current consumption of the second part of the second stage, wherein the sum of the first current and the second current is substantially constant.

2. The method as in claim 1, wherein providing the first current includes providing an amount of the first current to the first part of the second stage in correspondence to the size of at least one transistor.

3. The method as in claim 1, wherein adjusting the first current includes adjusting the first current in correspondence to the amplitude of at least one of the two input signals.

4. The method as in claim 1, wherein providing the second current includes providing an amount of the second current to the second part of the second stage in correspondence to the size of at least one transistor.

5. The method as in claim 1, wherein adjusting the second current includes adjusting the second current in correspondence to the amplitude of at least one of the two input signals.

6. An operational amplifier capable of dynamically compensating for varying current needs, comprising:
   a first stage configured to receive two input signals;
   a second stage coupled to the first stage, wherein the second stage includes a first part with a first output of the operational amplifier, and a second part with a second output of the operational amplifier;
   a first current source configured to provide a first bias current for biasing the first part of the second stage, wherein the first bias current is adjusted based on a current consumption of the first part of the second stage; and
   a second current source configured to provide a second bias current for biasing the second part of the second stage, wherein the second bias current is adjusted based on a current consumption of the second part of the second stage, and the sum of the first bias current and the second bias current is substantially constant.

7. The operational amplifier as in claim 6, wherein the first current source adjusts the first bias current by increasing the first bias current when the first output of the operational amplifier has a signal that is increasing, and the second current source adjusts the second bias current by increasing the second bias current when the second output of the operational amplifier has a signal that is increasing.

8. The operational amplifier as in claim 7, wherein the first current source includes a first set of transistors.

9. The operational amplifier as in claim 8, wherein the second current source includes a second set of transistors.

10. The operational amplifier as in claim 9, wherein an amount of the increase of the first bias current is determined, at least in part, by at least one channel dimension of each transistor of the first set of transistors.

11. The operational amplifier as in claim 9, further including a first resistance coupled between a power supply and a terminal of one of the first set of transistors;
   wherein an amount of the increase of the first bias current is determined, at least in part, by a voltage drop across the first resistance.

12. The operational amplifier as in claim 10, wherein an amount of the increase of the second bias current is determined, at least in part, by at least one channel dimension of each transistor of the second set of transistors.

13. The operational amplifier as in claim 11, further including a second resistance coupled between the power supply and a terminal of one of the second set of transistors;
   wherein the amount of the increase of the second bias current is substantially determined by a voltage drop across the second resistance.

14. The operational amplifier as in claim 8, wherein at least one of the first set of transistors is an MOSFET.

15. The operational amplifier as in claim 8, wherein at least one of the first set of transistors is a bipolar junction transistor.

16. The operational amplifier as in claim 9, wherein at least one of the second set of transistors is an MOSFET.

17. The operational amplifier as in claim 9, wherein at least one of the second set of transistors is a bipolar junction transistor.

18. The operational amplifier as in claim 11, wherein the first resistance is comprised of at least one resistor.

19. The operational amplifier as in claim 13, wherein the second resistance is comprised of at least one resistor.

20. An integrated circuit configured to dynamically compensate for varying current needs, comprising:
   a first stage configured to receive two input signals;
   a second stage coupled to the first stage, wherein the second stage includes a first part with a first output of the operational amplifier, and a second part with a second output of the operational amplifier;

a first set of transistors configured to form a first current source to provide a first bias current for biasing the first part of the second stage; and a second set of transistors configured to form a second current source to provide a second bias current for biasing the second part of the second stage, wherein the first current source is configured to increase the first bias current when the first output of the operational amplifier has a signal that is increasing, and the second current source is configured to increase the second bias current when the second output of the operational amplifier has a signal that is increasing, and wherein the sum of the first bias current and the second bias current is substantially constant.

21. The integrated circuit as in claim 20, wherein the first set transistors and the second set of transistors are MOSFETS.